(12) United States Patent
Lee et al.

(10) Patent No.: US 8,795,539 B2  
(45) Date of Patent: Aug. 5, 2014

(54) BLOCK COPOLYMER AND METHOD OF FORMING PATTERNS BY USING THE SAME

(75) Inventors: Su Mi Lee, Hwaseong-si (KR); Mio Hyuck Kang, Seoul (KR); Eun-Ae Kwak, Gunpo-si (KR); Moon Gyu Lee, Suwon-si (KR); Bong-Jin Moon, Seoul (KR); Joona Bang, Seoul (KR); Hyun Jung Jung, Seoul (KR)

(73) Assignees: Samsung Display Co., Ltd., Yongin, Gyeonggi-Do (KR); Korea University Research and Business Foundation, Seoul (KR)

( * ) Notice: Subject to any disclaimer, the term of this patent is extended or adjusted under 35 U.S.C. 154(b) by 206 days.

(21) Appl. No.: 13/241,905

(22) Filed: Sep. 23, 2011

(65) Prior Publication Data

US 2012/0080404 A1    Apr. 5, 2012

(30) Foreign Application Priority Data

Sep. 30, 2010    (KR) .................. 10-2010-0095176

(51) Int. Cl.  
    *C23F 1/02*      (2006.01)

(52) U.S. Cl.  
    USPC .......... 216/37; 526/266; 526/319; 526/329.2; 526/329.7

(58) Field of Classification Search  
    USPC ............... 216/37; 526/266, 319, 329.2, 329.7  
    See application file for complete search history.

(56) References Cited

U.S. PATENT DOCUMENTS

| | | | |
|---|---|---|---|
| 5,348,835 A | * | 9/1994 | Oba et al. .................. 430/192 |
| 8,481,246 B2 | * | 7/2013 | Asakawa et al. ............ 430/296 |
| 2007/0155926 A1 | * | 7/2007 | Matyjaszewski et al. . 526/303.1 |
| 2008/0038467 A1 | | 2/2008 | Jagannathan et al. |
| 2009/0179002 A1 | | 7/2009 | Cheng et al. |
| 2009/0186234 A1 | | 7/2009 | Colburn et al. |
| 2010/0143846 A1 | * | 6/2010 | Yamazawa ................. 430/306 |
| 2012/0244474 A1 | * | 9/2012 | Asakawa et al. ............ 430/296 |

FOREIGN PATENT DOCUMENTS

| | | | |
|---|---|---|---|
| JP | 2007-313568 | | 12/2007 |
| JP | 2008-036491 | | 2/2008 |
| KR | 1020080077530 | | 8/2008 |
| KR | 1020080107931 | | 12/2008 |
| KR | 100885666 | | 2/2009 |
| KR | 1020090081532 | | 7/2009 |
| KR | 100930966 | | 12/2009 |
| KR | 10-2010-0068014 | * | 6/2010 |
| KR | 100968241 | | 6/2010 |
| KR | 1020100068014 | | 6/2010 |
| KR | 10-0968241 | * | 7/2010 |
| KR | 1020100080336 | | 7/2010 |

\* cited by examiner

*Primary Examiner* — Peter D. Mulcahy  
*Assistant Examiner* — Henry Hu  
(74) *Attorney, Agent, or Firm* — F. Chau & Associates, LLC

(57) ABSTRACT

A method of forming patterns includes forming a layer composed of a ketene based random copolymer on a substrate, forming a block copolymer on the ketene based random copolymer layer and patterning the ketene based random copolymer layer by removing a part of the block copolymer and a portion of the ketene based random copolymer layer.

13 Claims, 8 Drawing Sheets

BLOCK COPOLYMER AND METHOD OF FORMING PATTERNS BY USING THE SAME

CROSS-REFERENCE TO RELATED APPLICATION

This application claims priority to Korean Patent Application No. 10-2010-0095176 filed on Sep. 30, 2010, the entire disclosure of which is hereby incorporated by reference herein its entirety.

BACKGROUND OF THE INVENTION (a) Technical Field

A block copolymer and a method of forming patterns by using the same.

(b) Description of the Related Art

A method of forming patterns using a block copolymer has been researched since this method enables patterns having a line width of about 50 nm or less to be formed, and this method is also relatively simple and inexpensive. In addition, with the method of forming patterns using the block copolymer, various sizes of patterns may be formed by controlling the molecular weight of the block copolymer, and various types of patterns may be formed by controlling the molecular weight ratio of the block copolymer.

A morphological direction of the surface of a target object such as, for example, a substrate and the like may be controlled by a neutral surface treatment. For example, a hydroxy terminated random copolymer, a benzocyclobutene (BCB) based cross-linkable random copolymer, an azide based cross-linkable random copolymer, and the like may be used in the neutral surface treatment.

However, in the hydroxy terminated random copolymer, the processing time for forming the patterns may be long because a heat treatment time may take about 3 days. In the BCB based cross-linkable random copolymer, synthesis of BCB may be complicated and the processing cost may be expensive. In the azide based cross-linkable random copolymer, reaction efficiency of azide may be low. In addition, since the BCB based cross-linkable random copolymer and the azide based cross-linkable random copolymer do not form a covalent-bond with a substrate and use only crosslinks between polymer layers, adherence between the substrate and the polymer layer may not be strong.

SUMMARY OF THE INVENTION

An exemplary embodiment of the present invention provides a method of forming patterns which includes forming a layer composed of a ketene based random copolymer on a substrate, forming a block copolymer on the ketene based random copolymer layer and patterning the ketene based random copolymer layer by removing a part of the block copolymer and a portion of the ketene based random copolymer layer.

For example, the method of forming patterns may include coating the ketene based random copolymer layer on a substrate, performing an ultraviolet-ray treatment or a heat treatment with respect to the ketene based random copolymer layer, coating the block copolymer thereon, performing an ultraviolet-ray treatment or a heat treatment with respect to the block copolymer, and removing the part of the block copolymer by an etching process. In addition, the method of forming patterns may further include forming a metal layer between the substrate and the ketene based random copolymer layer and etching the metal layer by using the block copolymer as an etching mask.

The block copolymer may have a vertical lamella shape. The part of the block copolymer is removed by one of dry-etching or wet etching.

The metal layer may be patterned in a wire grid form and the method of forming patterns may be used in a polarizer and the like of a display and the like.

The block copolymer may be polystyrene-block-polymethylmethacrylate (PS-b-PMMA), polystyrene-block-polyethyleneoxide (PS-b-PEO), polystyrene-block-poly-2-vinylpyridine (PS-b-PVP), polystyrene-block-polydimethylsiloxane (PS-b-PDMS), polystyrene-block-polyferrocenyldimethylsilane (PS-b-PFS), polystyrene-block-polyisoprene (PS-b-PI), and the like.

The ketene based random copolymer may be represented by the following Chemical Formula 2.

[Chemical Formula 2]

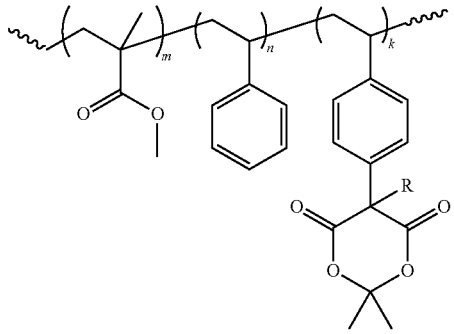

Herein, R is a substituted or non-substituted $C_1$-$C_{20}$ alkyl group and a substituted or non-substituted $C_6$-$C_{20}$ aryl group, m is about 50 to about 500, n is about 50 to about 500, and k is about 1 to about 40.

An exemplary embodiment of the present invention provides a method of patterning a metal layer, which includes forming a metal layer on a substrate, coating a layer composed of a ketene based random copolymer on the metal layer, performing one of a heat treatment or an ultraviolet ray (UV) treatment on the ketene based random copolymer layer to cross-link the ketene based random copolymer layer, coating a first block copolymer having a first part and a second part on the cross-linked ketene based random copolymer layer, performing one of a heat treatment or a UV treatment on the first block copolymer, removing the first part of the first block copolymer, etching the cross-linked ketene based random copolymer layer using the second part of the first block copolymer as an etching mask to thereby pattern the cross-linked ketene based random copolymer and removing the first block copolymer. The method further includes coating a second block copolymer having a first part and a second part on the patterned cross-linked ketene based random copolymer layer, removing the first part of the second block copolymer and etching the metal layer using the second part of the second block copolymer as an etching mask to thereby pattern the metal layer in a wire grid shape.

DETAILED DESCRIPTION OF EXEMPLARY EMBODIMENTS

Figure 1:
FIGS. 1 to 4 are schematic cross-sectional views illustrating a process of forming patterns according to an exemplary embodiment of the present invention.

Exemplary embodiments of the present invention will be described more fully hereinafter with reference to the accompanying drawings, in which exemplary embodiments of the invention are shown. As those skilled in the art would realize, exemplary embodiments described herein may be modified in various different ways, all without departing from the spirit or scope of the present invention. The drawings and description are to be regarded as illustrative in nature and not restrictive. Like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

In the present specification, unless otherwise specifically stated, the term "substituted" means that a matter is substituted by halogen, a $C_1$-$C_{20}$ haloalkyl group, a $C_1$-$C_{20}$ alkyl group, a $C_1$-$C_{20}$ alkoxy group, a $C_6$-$C_{30}$ aryl group, or a $C_6$-$C_{30}$ aryloxy group.

Hereinafter, a block copolymer according to an exemplary embodiment of the present invention and a method of forming patterns by using the same will be described in detail.

A method of forming patterns according to an exemplary embodiment of the present invention uses a ketene based random copolymer. The ketene based random copolymer may form a covalent bond with a substrate when a functional group of the ketene based random copolymer such as amine group or hydroxyl group is disposed on the surface of a substrate, and accordingly, using the ketene based random copolymer may also enable wire-grid patterning at a small area. In addition, the ketene based random copolymer is readily cross-linked. For example, a crosslink bond may be formed at about 200° C. to about 300° C. for about 10 seconds to about 1 hour. In addition, the ketene based random copolymer is readily synthesized and the process cost is relatively inexpensive.

For example, the ketene may be a compound represented by the following Chemical Formula 1.

[Chemical Formula 1]

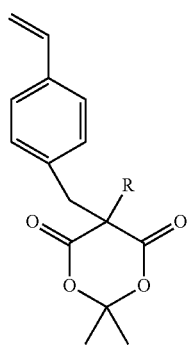

Herein, R is a substituted or non-substituted $C_1$-$C_{20}$ alkyl group and a substituted or non-substituted $C_6$-$C_{20}$ aryl group. On the basis of a kind of R, cross-link conditions, and characteristics of the ketene based random copolymer may be controlled.

When R is a phenyl group, the ketene may be synthesized on the basis of the following Reaction Formula 1.

[Reaction Formula 1]

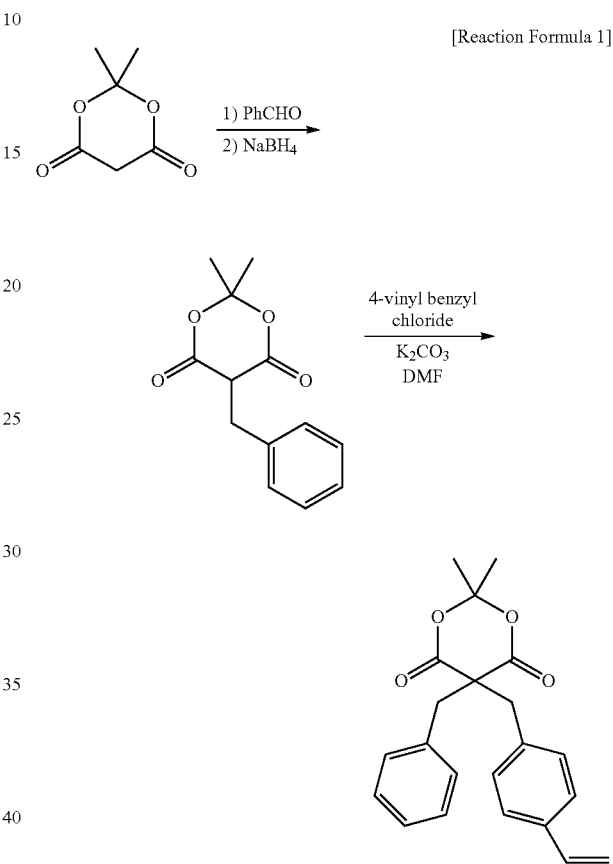

Herein, DMF is dimethylformamide. While benzaldehyde (PhCHO) is added to Medrum's acid, reductive alkylation is progressed. Next, 4-vinyl benzyl chloride is added and the reaction is progressed.

For example, the following Reaction Formula 2 illustrates an example of a crosslinkability control of a copolymer using the ketene.

[Reaction Formula 2]

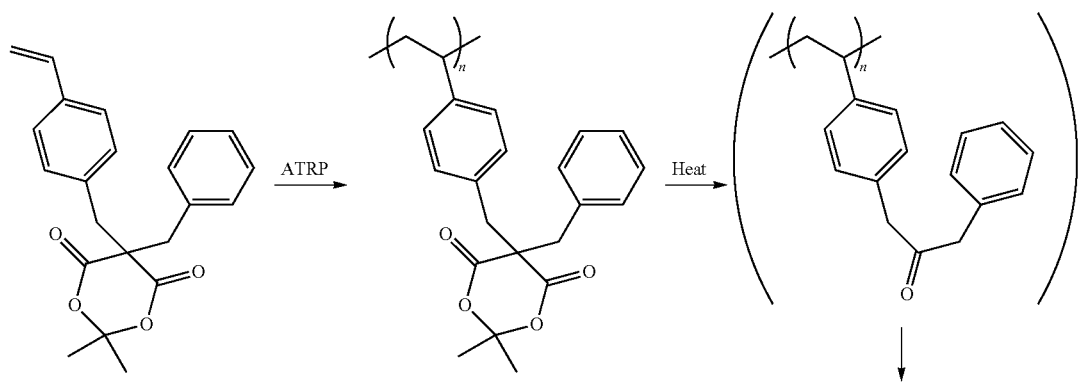

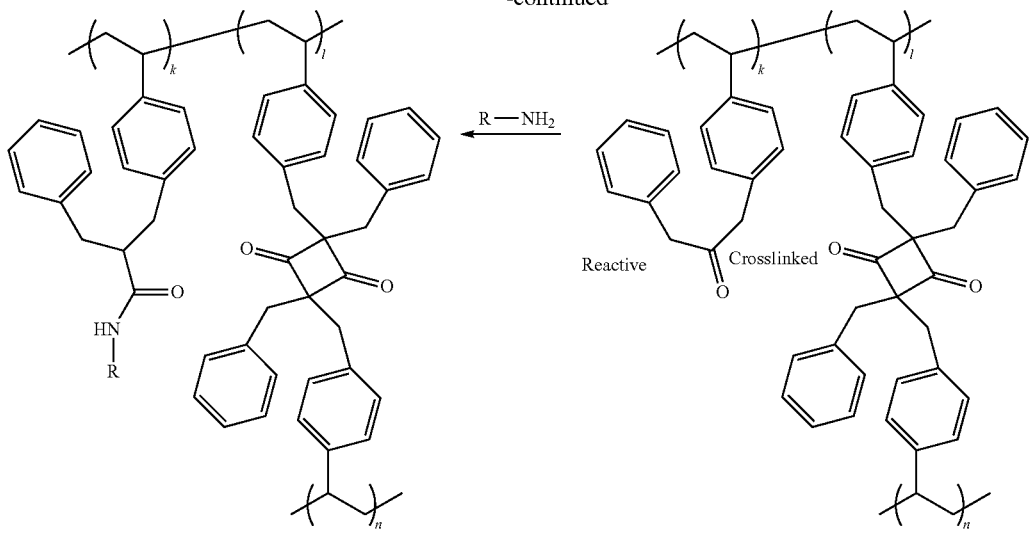

The ketene including a phenyl group forms a polymer through an atom transfer radical polymerization (ATRP). A plurality of ketenes may be formed as a reactive site at a temperature of, for example, about 230° C. or more. The plurality of ketenes react with each other to be cross-linked. Next, amine (R—NH$_2$) is added and the reaction may be progressed. Herein, amine may be aliphatic amine or aromatic amine. N, k, and l are independently about 1 to about 500.

For example, the ketene based random copolymer in accordance with an exemplary embodiment of the present invention may be a compound represented by the following Chemical Formula 2.

[Chemical Formula 2]

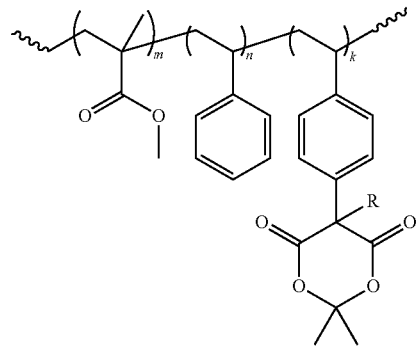

Herein, R may be a substituted or non-substituted $C_1$-$C_{20}$ alkyl group and a substituted or non-substituted $C_6$-$C_{20}$ aryl group. In addition, m may be about 50 to about 500, n may be about 50 to about 500, and k may be about 1 to about 40. For example, the average molecular weight of the ketene based random copolymer may be about 10 kg/mol to about 100 kg/mol and a polydispersity index (PDI) may be about 1.0 to about 2.0.

For example, the ketene based random copolymer in accordance with an exemplary embodiment of the present invention may be synthesized on the basis of the following Reaction Formula 3, and the cost is relatively inexpensive and the synthesis is readily performed.

[Reaction Formula 3]

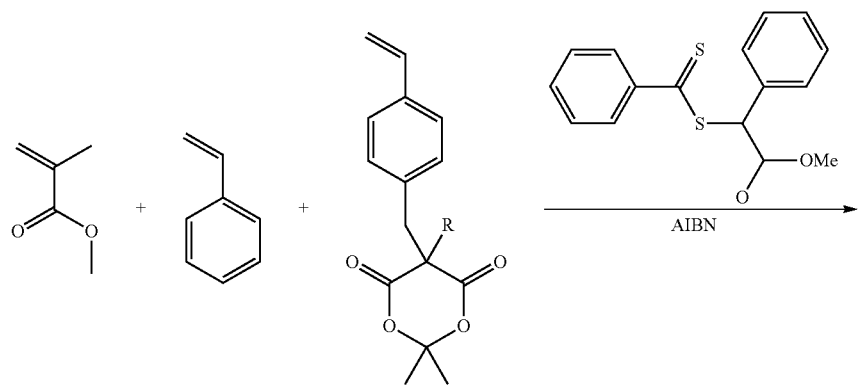

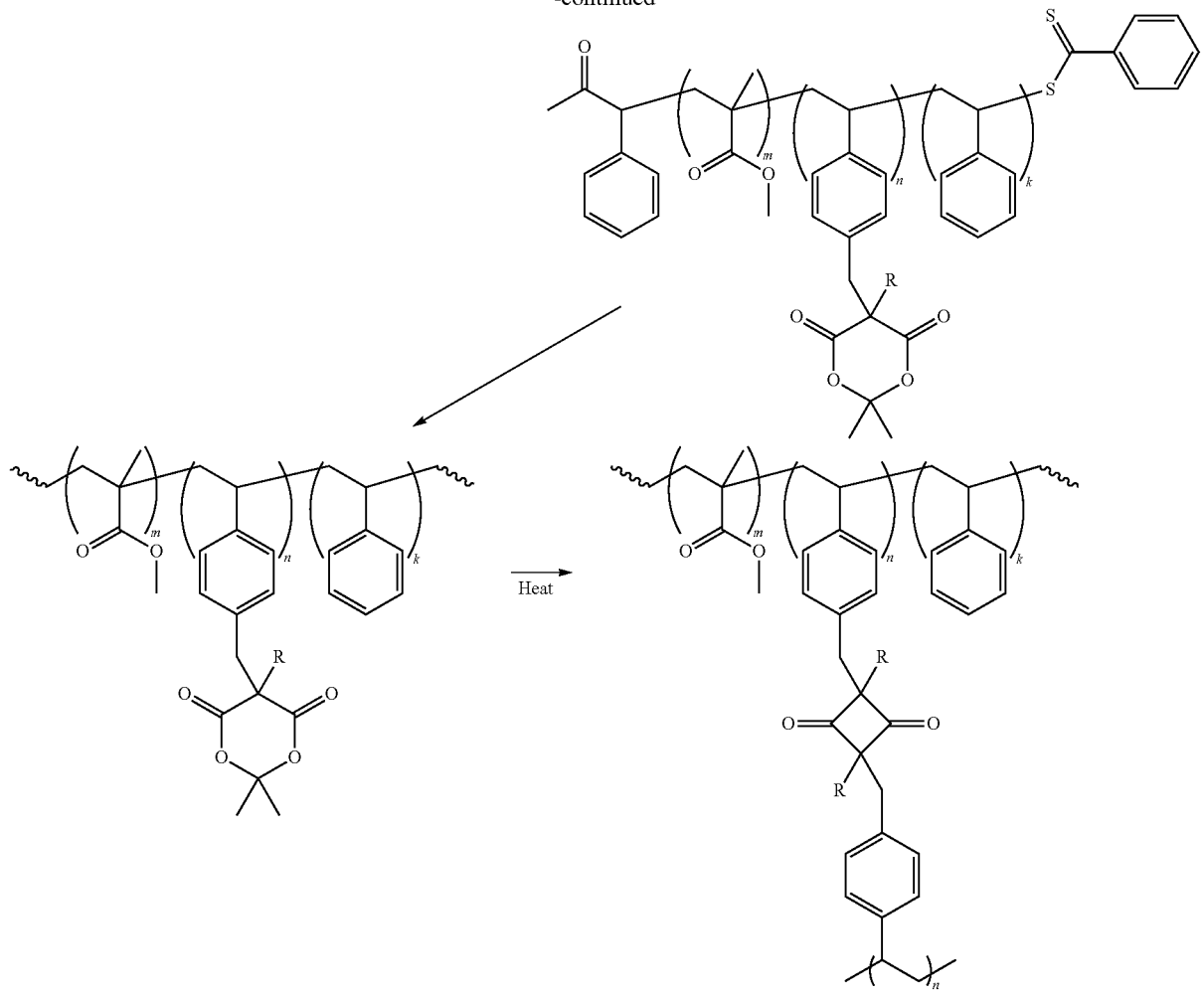

A copolymer may be synthesized from a monomer including, for example, methyl meth acrylate (MMA), styrene, and Medrum's acid through an RAFT polymerization. Herein, R is a substituted or non-substituted $C_1$-$C_{20}$ alkyl group and a substituted or non-substituted $C_6$-$C_{20}$ aryl group, AIBN is 2,2'-Azobis(2-methylpropionitrile), m is about 50 to about 500, n is about 50 to about 500, and k is about 1 to about 40. The plurality of ketenes react with each other to be cross-linked by applying heat of, for example, about 200° C. to about 300° C. The ketene based random copolymer in accordance with an exemplary embodiment of the present invention may have various characteristics based on R.

FIGS. 1 to 4 are schematic cross-sectional views illustrating a process of forming patterns according to an exemplary embodiment of the present invention.

Referring to FIG. 1, a substrate 110 is prepared. The substrate 110 may include, for example, glass, plastic, metal oxide, or the like.

Figure 2:
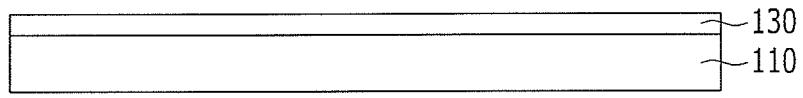

Referring to FIG. 2, a ketene based random copolymer is coated on the substrate 110 to form a ketene based random copolymer layer 130 thereon. For example, a spin coating method or the like may be used. The ketene based random copolymer layer 130 may have a thickness of, for example, about 5 nm to about 200 nm. However, the thickness of the ketene based random copolymer layer 130 is not limited to the above thickness but rather the thickness may be varied as desired. In addition, as will be described in further detail later in connection with FIGS. 5-12, a metal layer may be disposed between the substrate 110 and the ketene based random copolymer layer 130. Herein, the metal layer may include reflective metal such as, for example, aluminum and the like. For example, the metal layer may be a material usable as a wire grid polarizer.

Referring back to FIG. 2, for example, after coating the ketene based random copolymer to form the ketene based random copolymer layer 130, a heat treatment or an ultraviolet ray treatment is performed with respect to the ketene based random copolymer layer 130 and as a result, the ketene based random copolymer layer 130 may be cross-linked. For example, a heat treatment temperature may be about 200° C. to about 300° C. and a cross-linking time may be about 30 seconds to about 1 hour. Accordingly, the process costs for forming the patterns may be reduced and the process time for forming the patterns may be shortened. It is noted that other methods in addition to those mentioned above may also be used to cross-link the ketene based random copolymer layer 130 such as, for example, chemical reactions initiated by pressure and change in pH.

Herein, since the surface of the substrate 110 is neutral-treated by the ketene based random copolymer layer 130, a morphological direction of the surface of the substrate 110 may be controlled.

Figure 3:
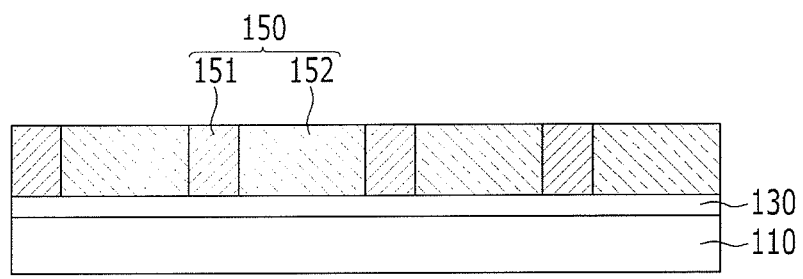

Referring to FIG. 3, a block copolymer 150 is coated on the ketene based random copolymer layer 130. For example, the block copolymer 150 may include two parts 151 and 152 and have a thickness of about 30 nm or more.

For example, the block copolymer 150 may be polystyrene-block-polymethylmethacrylate (PS-b-PMMA), polystyrene-block-polyethyleneoxide (PS-b-PEO), polystyrene-block-poly-2-vinylpyridine (PS-b-PVP), polystyrene-block-polydimethylsiloxane (PS-b-PDMS), polystyrene-block-polyferrocenyldimethylsilane (PS-b-PFS), polystyrene-block-polyisoprene (PS-b-PI), and the like.

For example, after coating the block copolymer 150, an ultraviolet ray treatment or a heat treatment may be performed on the block copolymer 150 and as a result, the block copolymer 150 may have a vertical lamella shape on the basis of the ketene based random copolymer layer 130. For example, heat treatment conditions after coating the block copolymer 150 may be performed at a temperature of about 170° C. to about 250° C. and a time of about 3 hours to about 1 week.

Figure 4:
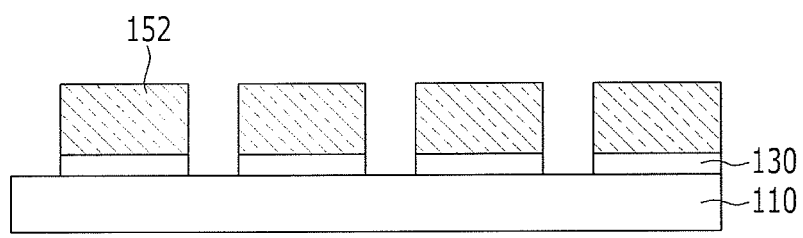

Referring to FIG. 4, part 151 of the block copolymer 150 is etched to form patterns.

FIGS. 5 to 12 are schematic cross-sectional views illustrating a process of manufacturing a reflective polarizer according to an exemplary embodiment of the present invention.

Figure 5:
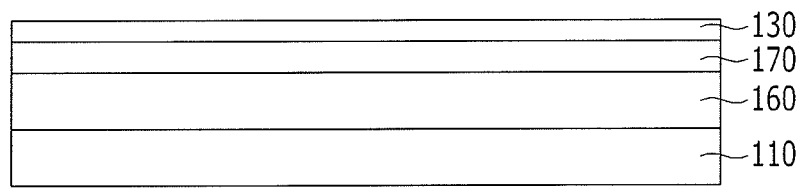
FIGS. 5 to 12 are schematic cross-sectional views illustrating a process of manufacturing a reflective polarizer according to an exemplary embodiment of the present invention.

Referring to FIG. 5, a metal layer 160 is formed on a substrate 110. The metal layer 160 may be a material usable as a wire grid polarizer such as, for example, aluminum and the like and have a thickness of about 80 nm. Other materials may also be used to form the metal layer 160 including but not limited to silver, gold and copper. In addition, it is noted that the thickness of the metal layer 160 is not limited to the above thickness but rather the thickness may be varied as desired. An insulating layer 170 is formed on the metal layer 160. The insulating layer 170 may include, for example, silicon oxide (SiOx). Alternatively, the forming of the insulating layer 170 may be omitted. Now referring back to the current embodiment of FIG. 5, a ketene based random copolymer is coated on the insulating layer 170 to form a ketene based random copolymer layer 130 on the insulating layer 170 and then, for example, a heat treatment or an ultraviolet ray treatment is performed thereon to cross-link the ketene based random copolymer layer 130. It is noted that other methods in addition to those mentioned above may also be used to cross-link the ketene based random copolymer layer 130 such as, for example, chemical reactions initiated by pressure and change in pH.

Figure 6:
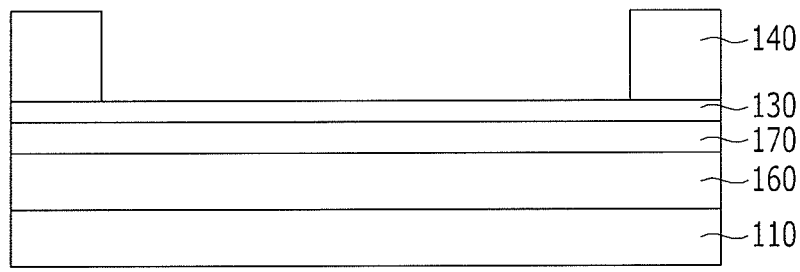

Referring to FIG. 6, a photoresist is coated on the ketene based random copolymer layer 130 and then the photoresist is patterned to form a photoresist pattern 140.

Figure 7:
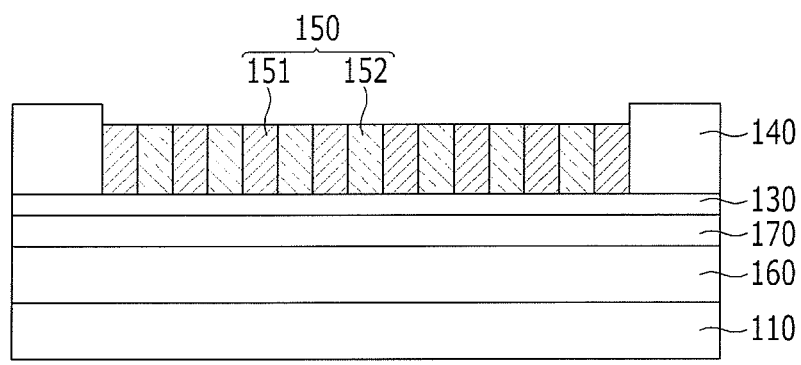

Referring to FIG. 7, a first block copolymer 150 is coated on the ketene based random copolymer layer 130 and then, for example, a heat treatment or an ultraviolet ray treatment is performed thereon. As shown in FIG. 7, the block copolymer, may include, for example, two parts 151 and 152.

Figure 8:
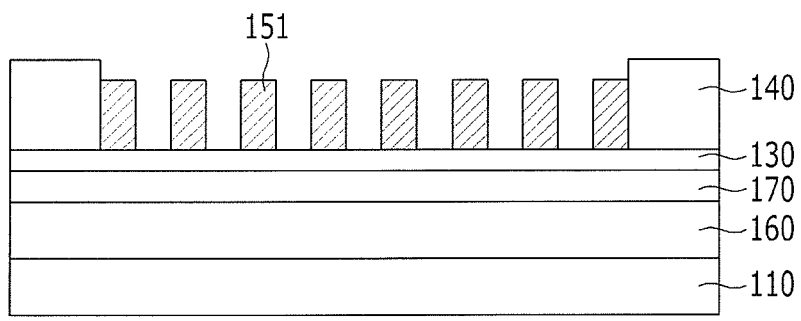

Referring to FIG. 8, part 152 of the block copolymer 150 may be, for example, dry-etched or wet-etched. For example, in the case where the block copolymer 150 is PS-b-PMMA, PMMA may be etched and PS may remain.

Figure 9:
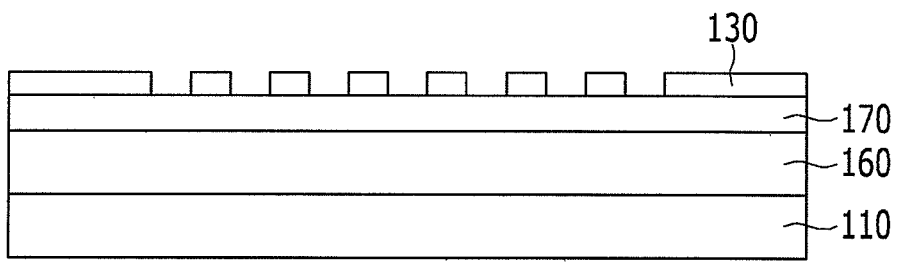

Referring to FIG. 9, the ketene based random copolymer layer 130 is patterned by using the other part 151 of the first block copolymer 150 as an etching mask. The first block copolymer 150 including the other part 151 and the photoresist pattern 140 are then each removed after patterning the ketene based random copolymer layer 130.

Figure 10:
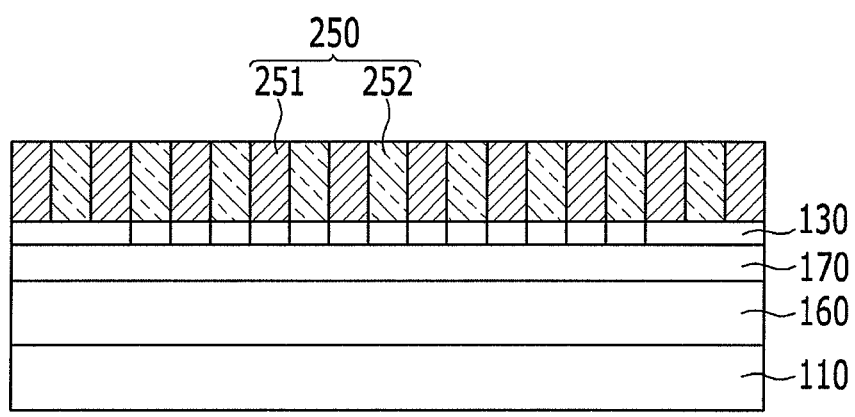

Referring to FIG. 10, a second block copolymer 250 is coated on the ketene based random copolymer layer 130 and then, for example, a heat treatment or an ultraviolet ray treatment is performed thereon. The second block copolymer 250 includes two parts 251 and 252 and may be substantially the same as the first block copolymer illustrated in FIG. 7.

Figure 11:
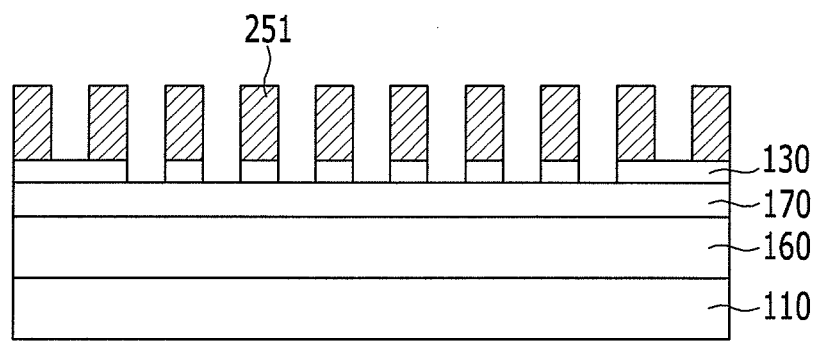

Referring to FIG. 11, part 252 of the second block copolymer 250 may be, for example, dry-etched or wet-etched. For example, in the case where the second block copolymer 250 is PS-b-PMMA, PMMA may be etched and PS may remain. Subsequently, the ketene based random copolymer layer 130, the insulating layer 170 and the metal layer 160 are then etched by using, for example, the second block copolymer 250 having part 251 as an etching mask in a half-tone mask method or the like to pattern the metal layer 160 in a wire grid shape.

Figure 12:
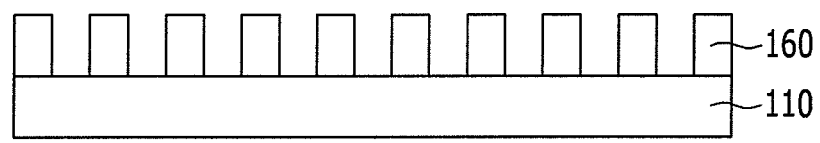

Referring to FIG. 12, the block copolymer 250 having part 251, the ketene based random copolymer layer 130 and the insulating layer 170, remaining after the patterning of the metal layer 160 are then each removed, thereby leaving the metal layer 160 which has been patterned in the wire grid shape remaining on the substrate 110. Accordingly, the metal layer 160 patterned in the wire grid shape may be used as a polarizer and the like of a display and the like. For example, the metal layer 160 may be used as a reflective polarizer of a reflective display. Further, a wire grid pattern of, for example, about 10 nm to about 100 nm may be implemented on a large area substrate. For example, a wire grid pattern of about 65 nm may be implemented. In addition, the metal layer 160 may be used for at least one of upper or lower polarizers of a display such as, for example, a general liquid crystal display and the like.

Hereinafter, exemplary embodiments of the present invention will be described in more detail with reference to Examples, but the following Examples are only an example of exemplary embodiments of the present invention and exemplary embodiments of the present invention are not limited to the following Examples.

Example 1

A compound represented by the Chemical Formula 2 in which R is a phenyl group and a concentration of ketene is about 1.5 mole % was fabricated.

Example 2

A compound represented by the Chemical Formula 2 in which R is a phenyl group and a concentration of ketene is about 3.0 mole % was fabricated.

Example 3

A compound represented by the Chemical Formula 2 in which R is a phenyl group and a concentration of ketene is about 3.1 mole % was fabricated.

Example 4

A compound represented by the Chemical Formula 2 in which R is a phenyl group and a concentration of ketene is about 5 mole % was fabricated.

Example 5

A compound represented by the Chemical Formula 2 in which R is a phenyl group and a concentration of ketene is about 10.0 mole % was fabricated.

Evaluation of Crosslink Degree According to Coating Concentration

The ketene based random copolymer manufactured in the Example 3 and 4 were coated on a substrate in amounts of about 2.0 wt % and about 0.4 wt % and heat-treated at about 240° C. for about 1 hour in a vacuum state. A thickness of a thin film was measured by using an ellipsometry process.

TABLE 1

|  | Solution | After coating (nm) | After rinsing (nm) | Rate of change (%) |
|---|---|---|---|---|
| Example 3 | 2.0 wt % | 50.3 | 47.65 | −5 |
|  | 0.4 wt % | 10.9 | 10.85 | 0 |
| Example 4 | 2.0 wt % | 56.5 | 56.85 | 0 |
|  | 0.4 wt % | 10.65 | 10.65 | 0 |

As shown in Table 1, variation in a thickness was almost not in each of Example 3 and Example 4. In each of Example 3 and Example 4, an amount of Medrum's acid for cross-linking was sufficient.

Evaluation of Crosslink Degree According to Time

The ketene based random copolymer manufactured in the Example 3 and 4 were coated on a substrate in an amount of about 0.4 wt % and heat-treated at about 240° C. for about 30, 60, 90, and 180 minutes in a vacuum state. A polymer layer without cross-linking after the heat-treatment was removed and a thickness of a remaining thin film was measured by using an ellipsometry process. The thickness after casting the solution including about 0.4 wt % of the ketene based random copolymer manufactured in Examples 3 and 4 was about 11 nm.

TABLE 2

|  | Time (min) | Solution | After rinsing (nm) |
|---|---|---|---|
| Example 3 | 30 | 0.4 wt % | 10.5 |
|  | 60 | 0.4 wt % | 10.35 |
|  | 90 | 0.4 wt % | 10.35 |
|  | 180 | 0.4 wt % | Oxidation |
| Example 4 | 30 | 0.4 wt % | 11 |
|  | 60 | 0.4 wt % | 10.85 |
|  | 90 | 0.4 wt % | 10.95 |
|  | 180 | 0.4 wt % | 10.8 |

As shown in Table 2, the cross-linking was performed at about 30 minutes or more.

The ketene based random copolymers manufactured in the Examples 1, 2, 4, and 5 were coated on a substrate in an amount of about 0.4 wt % and heat-treated at about 200° C., about 230° C., and about 250° C. for about 10 seconds to about 1 hour in nitrogen atmosphere.

A polymer layer without cross-linking after the heat-treatment was removed and the thickness of a remaining thin film was measured by using an ellipsometry process. The thickness after casting the solution including about 0.4 wt % of the ketene based random copolymers manufactured in Examples 1, 2, 4, and 5 was about 12 nm.

TABLE 3

|  | Temperature | Time | Solution | Film thickness after rinsing (nm) |
|---|---|---|---|---|
| Example 1 | 200° C. | 10 sec | 0.4 wt % | 2.27 |
|  |  | 30 sec | 0.4 wt % | 3.00 |
|  |  | 1 min | 0.4 wt % | 4.11 |
|  |  | 5 min | 0.4 wt % | 6.8 |
|  |  | 10 min | 0.4 wt % | 7.55 |
|  |  | 30 min | 0.4 wt % | 9.01 |
|  |  | 60 min | 0.4 wt % | 8.82 |
|  | 230° C. | 10 sec | 0.4 wt % | 4.49 |
|  |  | 30 sec | 0.4 wt % | 4.7 |
|  |  | 1 min | 0.4 wt % | 5.9 |
|  |  | 5 min | 0.4 wt % | 6.26 |
|  |  | 10 min | 0.4 wt % | 7.43 |
|  |  | 30 min | 0.4 wt % | 10.48 |
|  |  | 60 min | 0.4 wt % | 10.78 |
|  | 250° C. | 10 sec | 0.4 wt % | 6.34 |
|  |  | 30 sec | 0.4 wt % | 8.1 |
|  |  | 1 min | 0.4 wt % | 8.02 |
|  |  | 5 min | 0.4 wt % | 8.47 |
|  |  | 10 min | 0.4 wt % | 7.36 |
|  |  | 30 min | 0.4 wt % | 8.18 |
|  |  | 60 min | 0.4 wt % | 7.88 |
| Example 2 | 200° C. | 10 sec | 0.4 wt % | 3.44 |
|  |  | 30 sec | 0.4 wt % | 4.67 |
|  |  | 1 min | 0.4 wt % | 4.69 |
|  |  | 5 min | 0.4 wt % | 8.37 |
|  |  | 10 min | 0.4 wt % | 9.65 |
|  |  | 30 min | 0.4 wt % | 9.88 |
|  |  | 60 min | 0.4 wt % | 10.17 |
|  | 230° C. | 10 sec | 0.4 wt % | 4.62 |
|  |  | 30 sec | 0.4 wt % | 5.07 |
|  |  | 1 min | 0.4 wt % | 6.67 |
|  |  | 5 min | 0.4 wt % | 8.44 |
|  |  | 10 min | 0.4 wt % | 9.18 |
|  |  | 30 min | 0.4 wt % | 11.45 |
|  |  | 60 min | 0.4 wt % | 11.37 |
|  | 250° C. | 10 sec | 0.4 wt % | 9.79 |
|  |  | 30 sec | 0.4 wt % | 11.9 |
|  |  | 1 min | 0.4 wt % | 13.39 |
|  |  | 5 min | 0.4 wt % | 13.15 |
|  |  | 10 min | 0.4 wt % | 14.27 |
|  |  | 30 min | 0.4 wt % | 13.29 |
|  |  | 60 min | 0.4 wt % | 12.29 |
| Example 4 | 200° C. | 10 sec | 0.4 wt % | 3.88 |
|  |  | 30 sec | 0.4 wt % | 4.72 |
|  |  | 1 min | 0.4 wt % | 5.59 |
|  |  | 5 min | 0.4 wt % | 10.28 |
|  |  | 10 min | 0.4 wt % | 11.04 |
|  |  | 30 min | 0.4 wt % | 10.43 |
|  |  | 60 min | 0.4 wt % | 9.66 |
|  | 230° C. | 10 sec | 0.4 wt % | 5.53 |
|  |  | 30 sec | 0.4 wt % | 5.44 |
|  |  | 1 min | 0.4 wt % | 8.04 |
|  |  | 5 min | 0.4 wt % | 8.76 |
|  |  | 10 min | 0.4 wt % | 9.28 |
|  |  | 30 min | 0.4 wt % | 11.25 |
|  |  | 60 min | 0.4 wt % | 11.29 |
|  | 250° C. | 10 sec | 0.4 wt % | 9.67 |
|  |  | 30 sec | 0.4 wt % | 11.18 |
|  |  | 1 min | 0.4 wt % | 11.44 |
|  |  | 5 min | 0.4 wt % | 11.31 |
|  |  | 10 min | 0.4 wt % | 11.02 |
|  |  | 30 min | 0.4 wt % | 10.43 |
|  |  | 60 min | 0.4 wt % | 10.55 |
| Example 5 | 200° C. | 10 sec | 0.4 wt % | 5.36 |
|  |  | 30 sec | 0.4 wt % | 5.83 |
|  |  | 1 min | 0.4 wt % | 7.58 |
|  |  | 5 min | 0.4 wt % | 10.62 |
|  |  | 10 min | 0.4 wt % | 11.37 |
|  |  | 30 min | 0.4 wt % | 10.89 |
|  |  | 60 min | 0.4 wt % | 10.95 |
|  | 230° C. | 10 sec | 0.4 wt % | 6.86 |
|  |  | 30 sec | 0.4 wt % | 7.38 |
|  |  | 1 min | 0.4 wt % | 8.2 |
|  |  | 5 min | 0.4 wt % | 10.61 |
|  |  | 10 min | 0.4 wt % | 10.56 |
|  |  | 30 min | 0.4 wt % | 11.04 |
|  |  | 60 min | 0.4 wt % | 11.08 |
|  | 250° C. | 10 sec | 0.4 wt % | 11.18 |
|  |  | 30 sec | 0.4 wt % | 12.24 |
|  |  | 1 min | 0.4 wt % | 12.25 |
|  |  | 5 min | 0.4 wt % | 13.3 |

TABLE 3-continued

| Temperature | Time | Solution | Film thickness after rinsing (nm) |
|---|---|---|---|
| | 10 min | 0.4 wt % | 11.27 |
| | 30 min | 0.4 wt % | 11.63 |
| | 60 min | 0.4 wt % | 11.59 |

As shown in Table 3, the cross-linking was performed under various conditions for a minimal time.

Evaluation for Vertical Lamella Shape

Figure 13:
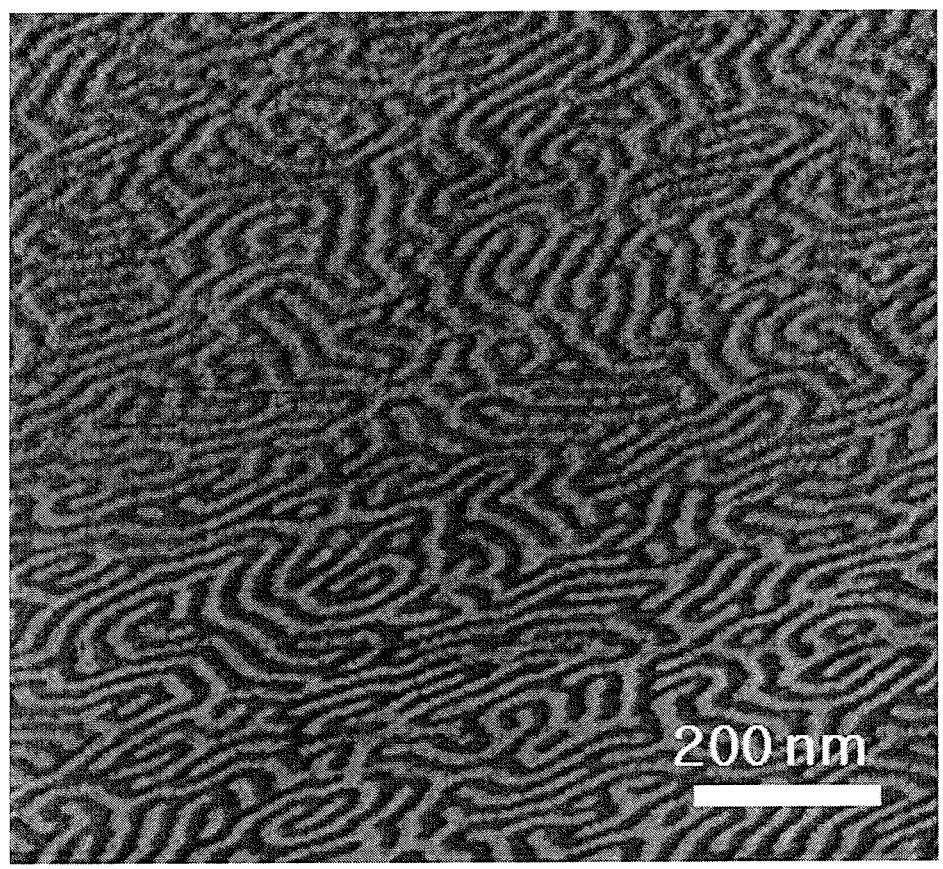
FIGS. 13 and 14 are schematic photographs illustrating a vertical lamella shape of a block copolymer according to an exemplary embodiment of the present invention.
Figure 14:
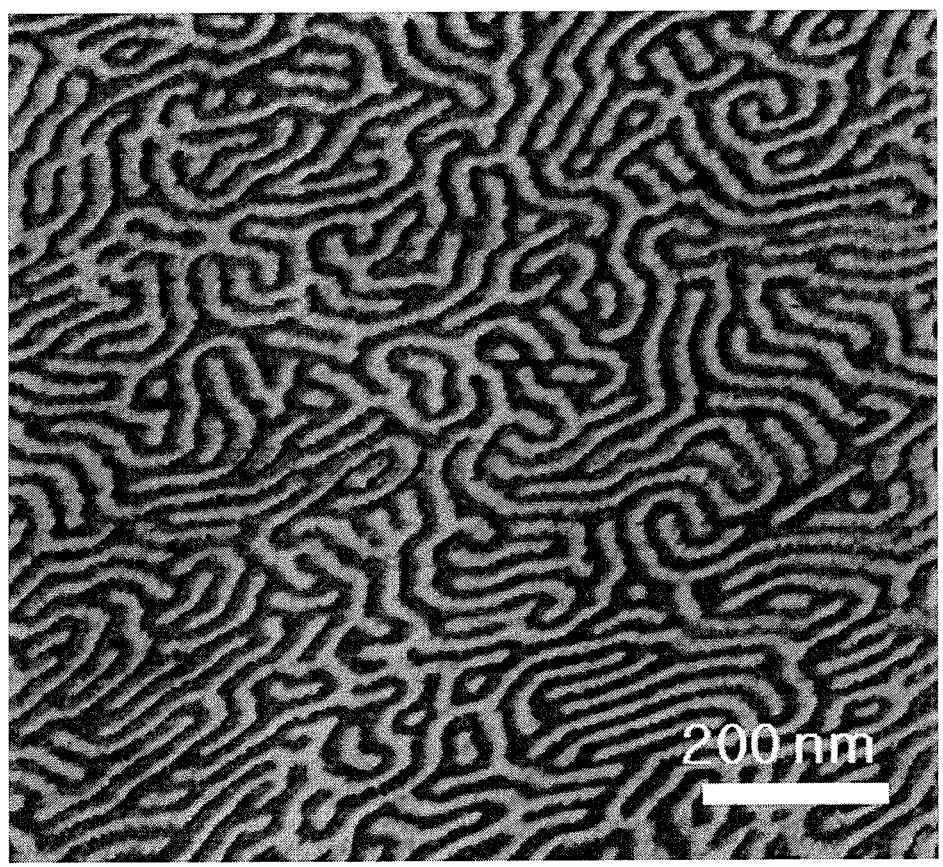

The ketene based random copolymer manufactured in the Example 1 was coated on a substrate in an amount of about 0.4 wt % and heat-crosslink-treated at about 240° C. for about 30 minutes and about 60 minutes in a vacuum state. Next, the block copolymer, PS-b-PMMA (PS:PMMA=48:46) having number average molecular weight of 94 kg/mol was coated on the block copolymer in an amount of about 1.3 wt % and heat-treated at about 190° C. for about 72 hours in a vacuum state. Photographs picked-up by an atomic force microscope (AFM) were shown in FIGS. 13 and 14. Referring to FIGS. 13 and 14, the block copolymer had a vertical lamella shape on the basis of the neutral treatment of the surface.

Evaluation for Adherence

The ketene based random copolymers manufactured in the Examples 1, 2, 4, and 5 and a known azide based random copolymer were coated on a substrate in an amount of about 0.4 wt % and heat-treated at about 230° C. for about 1 hour in nitrogen atmosphere. After the heat treatment, the ketene based random copolymers manufactured in the Examples 1, 2, 4, and 5 and the known azide based random copolymer were soaked in benzene and ultrasonic wave-treated for about 10, about 30, and about 60 minutes. A contact angle was verified through a contact angle measuring instrument. The thickness of a remaining thin film was measured by using an ellipsometry process. The thickness after casting the solution including about 0.4 wt % of the ketene based random copolymers manufactured in the Examples 1, 2, 4, and 5 was about 12 nm.

TABLE 4

| | Time (min) | Solution | Film thickness after ultrasonic wave treatment (nm) | Contact angle (degrees) |
|---|---|---|---|---|
| Azide random copolymer | 0 | 0.4 wt % | 11.9 | 82 |
| | 10 | 0.4 wt % | 2.7 | 66 |
| | 30 | 0.4 wt % | 1.7 | 66 |
| | 60 | 0.4 wt % | 2.3 | 62 |
| Example 1 | 0 | 0.4 wt % | 12 | 81 |
| | 10 | 0.4 wt % | 3.1 | 69 |
| | 30 | 0.4 wt % | 3.5 | 70 |
| | 60 | 0.4 wt % | 3.1 | 67 |
| Example 2 | 0 | 0.4 wt % | 12.1 | 81 |
| | 10 | 0.4 wt % | 11.4 | 77 |
| | 30 | 0.4 wt % | 11 | 73 |
| | 60 | 0.4 wt % | 11.6 | 73 |
| Example 4 | 0 | 0.4 wt % | 11.9 | 82 |
| | 10 | 0.4 wt % | 11.8 | 81 |
| | 30 | 0.4 wt % | 11.6 | 77 |
| | 60 | 0.4 wt % | 11 | 77 |
| Example 5 | 0 | 0.4 wt % | 12.3 | 81 |
| | 10 | 0.4 wt % | 11.7 | 84 |
| | 30 | 0.4 wt % | 12.1 | 80 |
| | 60 | 0.4 wt % | 12.2 | 80 |

As shown in Table 4, an increased contact force was verified. In azide random copolymer, the contact angle decreases very quickly, and in other words, an adhesive force is weak. In Examples 4 and 5, the contact angle decreases slowly or very little, and in other words, an adhesive force is strong. In azide random copolymer, the film thickness decreases very quickly, and in other words, an adhesive force is weak. In Examples 4 and 5, the film thickness decreases very little, and in other words, an adhesive force is strong.

Consequently, with the ketene based random copolymers of exemplary embodiments of the present invention, shorter processing times, reduced processing costs, and a more simplified synthesis process, may be realized in connection with forming these ketene based random copolymers. In addition, the ketone based random copolymers of exemplary embodiments of the present invention may be implemented to form wire grid patterns of about 10 nm to about 100 nm on a large-area substrate, be used regardless of a type of the substrate, be applied even in the patterning of a local area due to a chemical bond with the surface of a substrate, be used as a material for a neutral treatment for a vertical alignment of block copolymer, and also to manufacture a polarizer used in a display and the like.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming patterns, comprising:
   forming a layer composed of a ketene based random copolymer on a substrate;
   forming a block copolymer on the ketene based random copolymer layer; and
   patterning the ketene based random copolymer layer by removing a part of the block copolymer and a portion of the ketene based random copolymer layer.

2. The method of claim 1, further comprising:
   performing one of an ultraviolet-ray treatment or a heat treatment with respect to the ketene based random copolymer layer; and
   performing one of an ultraviolet-ray treatment or a heat treatment to the block copolymer; and wherein the ketene based random copolymer layer is coated on the substrate, wherein the block copolymer is coated on the ketene based random copolymer layer and wherein the part of the block copolymer is removed by an etching process.

3. The method of claim 2, further comprising:
   forming a metal layer between the substrate and the ketene based random copolymer layer; and
   etching the metal layer by using the block copolymer as an etching mask.

4. The method of claim 3, wherein:
   the metal layer is patterned in a wire grid shape.

5. The method of claim 3, wherein:
   the metal layer comprises a reflective metal.

6. The method of claim 5, wherein:
   the metal layer comprises aluminum.

7. The method of claim 1, wherein:
   the ketene based random copolymer is represented by the following Chemical Formula 2:

[Chemical Formula 2]

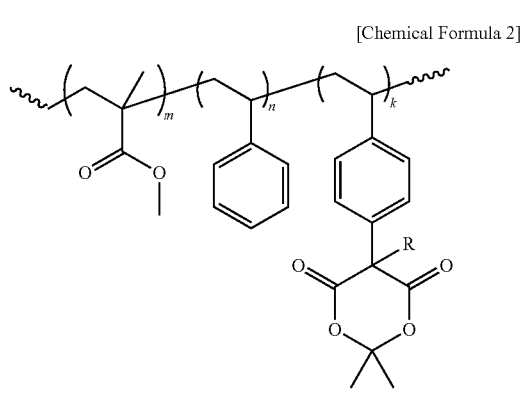

(wherein R is a substituted or non-substituted-$C_1$-$C_{20}$ alkyl group and a substituted or non-substituted $C_6$-$C_{20}$ aryl group, m is about 50 to about 500, n is about 50 to about 500, and k is about 1 to about 40).

8. The method of claim 7, wherein:

a number average molecular weight of the ketene based random copolymer is about 10 kg/mol to about 100 kg/mol and a polydispersity index (PDI) is about 1.0 to about 2.0.

9. The method of claim 1, wherein:

the ketene based random copolymer is synthesized on the basis of the following Reaction Formula 3:

[Reaction Formula 3]

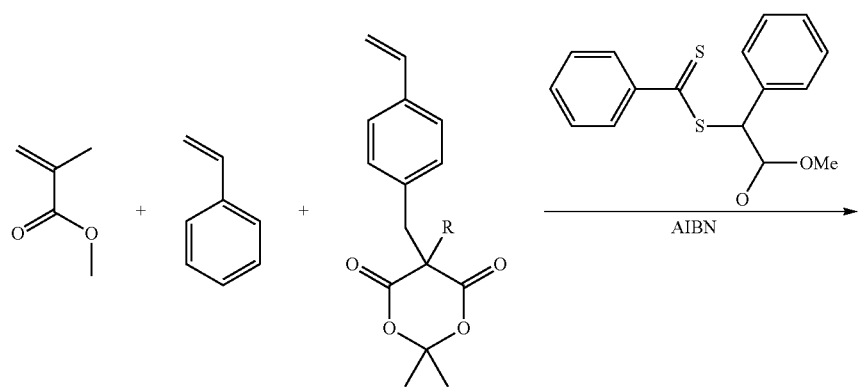

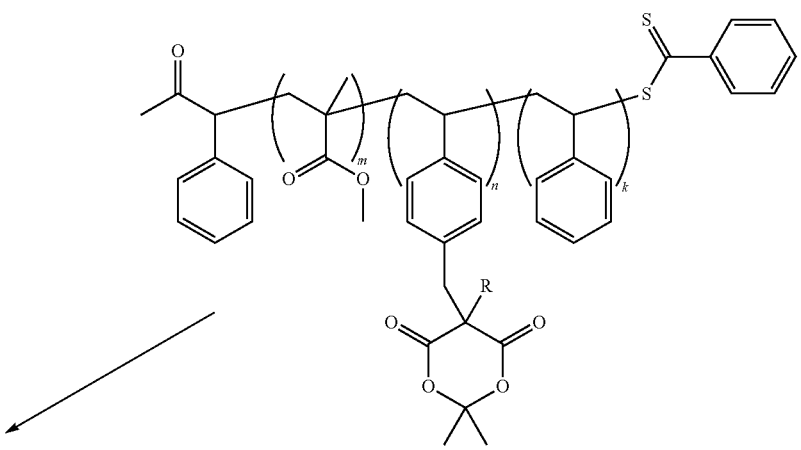

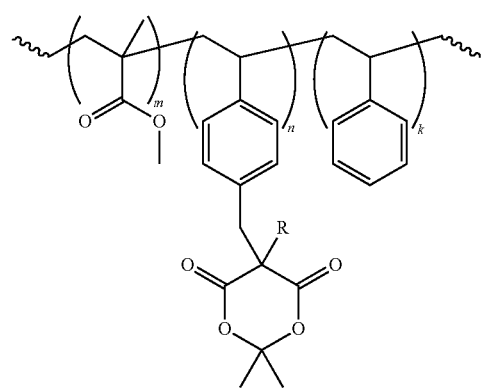

-continued

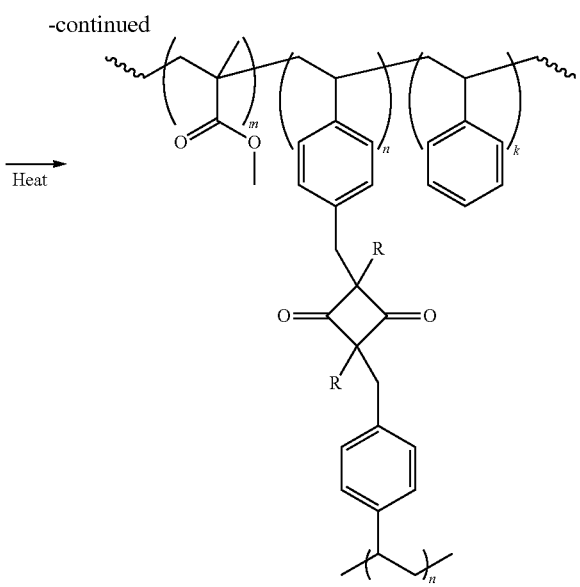

(wherein R is a substituted or non-substituted $C_1$-$C_{20}$ alkyl group and a substituted or non-substituted $C_6$-$C_{20}$ aryl group, AIBN is 2,2'-Azobis(2-methylpropionitrile), m is about 50 to about 500, n is about 50 to about 500, and k is about 1 to about 40).

10. The method of claim 1, wherein:
the ketene based random copolymer layer is cross-linked at about 200° C. to about 300° C. for about 10 seconds to about 1 hour.

11. The method of claim 1, wherein:
the block copolymer has a vertical lamella shape.

12. The method of claim 11, wherein:
the block copolymer is selected from the group consisting of polystyrene-block-polymethylmethacrylate (PS-b-PMMA), polystyrene-block-polyethyleneoxide (PS-b-PEO), polystyrene-block-poly-2-vinylpyridine (PS-b-PVP), polystyrene-block-polydimethylsiloxane (PS-b-PDMS), polystyrene-block-polyferrocenyldimethylsilane (PS-b-PFS), and polystyrene-block-polyisoprene (PS-b-PI).

13. The method of claim 11, wherein:
the part of the block copolymer is removed by one of dry-etching or wet etching.

* * * * *